(12) United States Patent
Liaw et al.

(10) Patent No.: US 7,649,226 B2
(45) Date of Patent: Jan. 19, 2010

(54) SOURCE AND DRAIN STRUCTURES AND MANUFACTURING METHODS

(75) Inventors: Jhon-Jhy Liaw, Hsin-Chu (TW); Mu-Chi Chiang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 366 days.

(21) Appl. No.: 11/702,807

(22) Filed: Feb. 6, 2007

(65) Prior Publication Data

US 2008/0185665 A1    Aug. 7, 2008

(51) Int. Cl.
*H01L 23/62*   (2006.01)
(52) U.S. Cl. ............ 257/344; 257/382; 257/E29.012
(58) Field of Classification Search .............. 257/408
See application file for complete search history.

(56) References Cited

U.S. PATENT DOCUMENTS 4,356,623 A * 11/1982 Hunter ..................... 438/305

2005/0148148 A1 * 7/2005 Cheng ..................... 438/299

* cited by examiner

*Primary Examiner*—Zandra Smith
*Assistant Examiner*—Paul E Patton
(74) *Attorney, Agent, or Firm*—Slater & Matsil, L.L.P.

(57) ABSTRACT

A semiconductor structure includes a semiconductor substrate; a first gate dielectric on the semiconductor substrate; a first gate electrode over the first gate dielectric; a first lightly doped source or drain (LDD) region in the semiconductor substrate and adjacent the first gate dielectric, wherein the first LDD region comprises arsenic; and a first deep source/drain region in the semiconductor substrate and adjacent the first gate dielectric. The first deep source/drain region comprises phosphorous, and a first phosphorous junction depth in the first deep source/drain region is greater than about three times a first arsenic junction depth in the first deep source/drain region.

18 Claims, 10 Drawing Sheets

SOURCE AND DRAIN STRUCTURES AND MANUFACTURING METHODS

TECHNICAL FIELD

This invention relates generally to semiconductor devices, and more particularly to the structure and fabrication methods of metal-oxide-semiconductor devices.

BACKGROUND

With the scaling of integrated circuits, metal-oxide-semiconductor (MOS) devices are becoming increasingly smaller. The junction depths of the MOS devices are also reduced accordingly. This reduction causes technical difficulties during the formation processes. For example, small MOS devices demand high doping concentrations in source and drain regions in order to reduce sheet resistance in the source and drain regions. Controlling implantation depth for forming shallow source and drain junctions while at the same time maintaining high doping concentration is difficult.

Conventionally, to achieve high doping concentration in the source and drain regions, arsenic is doped heavily into source and drain regions. Arsenic has relatively low diffusion length, and thus can be implanted to a high concentration without significantly affecting short channel characteristics and junction abruptness. However, arsenic atoms are heavy with an atomic weight of about 75. The implantation of arsenic thus introduces greater degree of defects, such as piping, than introducing other n-type impurities, such as phosphorous.

In small-scale MOS devices, for example, MOS devices formed using 65 nm technology or below, the junctions are shallow, and hence the pipes caused by arsenic implantation may extend to the junctions between source/drain regions and semiconductor substrates. Accordingly, when silicide regions are formed on source and drain regions, silicide spikes may be formed along the pipes, and thus shorting the silicide regions and the semiconductor substrates. This results in a significant increase in leakage currents, and even device failure.

A new MOS device structure and manufacturing methods for solving the above-discussed problems are thus needed.

SUMMARY OF THE INVENTION

In accordance with one aspect of the present invention, a semiconductor structure is provided. The semiconductor structure includes a semiconductor substrate; a first gate dielectric on the semiconductor substrate; a first gate electrode over the first gate dielectric; a first lightly doped source or drain (LDD) region in the semiconductor substrate and adjacent the first gate dielectric, wherein the first LDD region comprises arsenic; and a first deep source/drain region in the semiconductor substrate and adjacent the first gate dielectric. The first deep source/drain region comprises phosphorous, and a first phosphorous junction depth in the first deep source/drain region is greater than about three times a first arsenic junction depth in the first deep source/drain region.

In accordance with another aspect of the present invention, a semiconductor structure includes a semiconductor substrate; a gate dielectric on the semiconductor substrate; a gate electrode over the gate dielectric; an LDD region in the semiconductor substrate and adjacent the gate dielectric, wherein the LDD region comprises arsenic; and a deep source/drain region in the semiconductor substrate and adjacent the gate dielectric. The deep source/drain region comprises phosphorous, and a peak phosphorous concentration in the deep source/drain region is greater than about five times a peak arsenic concentration in the deep source/drain region.

In accordance with yet another aspect of the present invention, a method of forming a semiconductor structure includes a semiconductor substrate comprising a first region and a second region; a memory metal-oxide-semiconductor (MOS) device in the first region; and a logic MOS device in the second region. The memory MOS device includes a first gate dielectric on the semiconductor substrate; a first gate electrode over the first gate dielectric; a first LDD region in the semiconductor substrate and adjacent the first gate dielectric, wherein the first LDD region comprises arsenic; and a first deep source/drain region in the semiconductor substrate and adjacent the first gate dielectric. The first deep source/drain region comprises phosphorous, and a phosphorous junction depth in the first deep source/drain region is greater than an arsenic junction depth in the first deep source/drain region. The logic MOS device includes a second gate dielectric on the semiconductor substrate; a second gate electrode over the second gate dielectric; a second LDD region in the semiconductor substrate and adjacent the second gate dielectric, wherein the second LDD region comprises arsenic; and a second deep source/drain region in the semiconductor substrate and adjacent the second gate dielectric. The second deep source/drain region comprises arsenic and phosphorous, and an arsenic junction depth in the second deep source/drain region is substantially comparable to a phosphorous junction depth in the second deep source/drain region. The arsenic junction depth in the second deep source/drain region is greater than about two times the arsenic junction depth in the first deep source/drain region.

The advantageous features of the present invention include reduced silicide piping, and hence reduced leakage currents.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The intermediate stages of manufacturing a preferred embodiment of the present invention, which combines the formation of a memory metal-oxide-semiconductor (MOS) device and a logic MOS device, are illustrated. Throughout the various views and illustrative embodiments of the present invention, like reference numbers are used to designate like elements.

Figure 1:
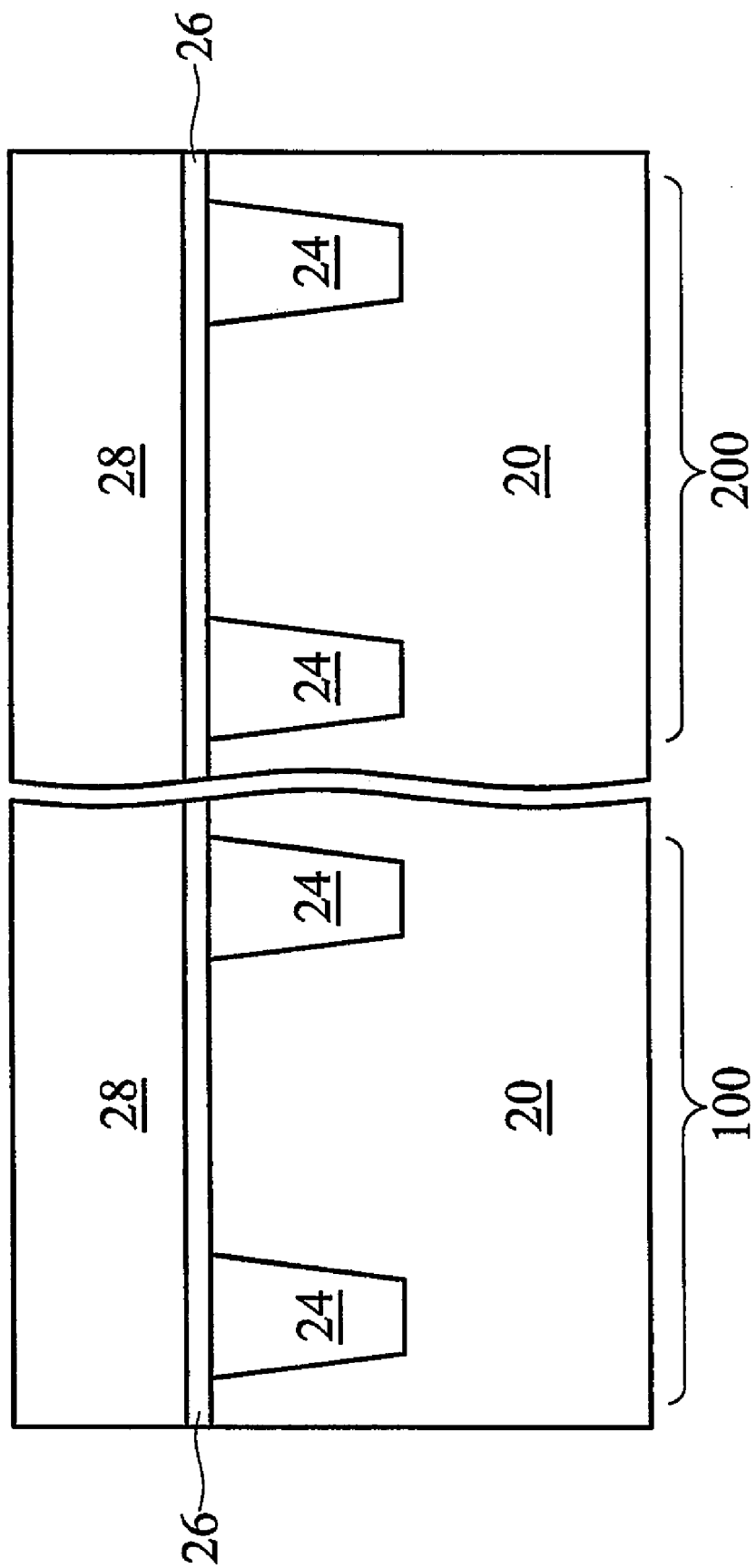
FIGS. 1 through 6 are cross-sectional views of intermediate stages in the manufacturing of an embodiment of the present invention, wherein MOS devices in the first and the second device regions have different dopant profiles.

FIG. 1 illustrates substrate 20, which includes memory device region 100 for forming an n-type memory MOS device, and logic device region 200 for forming a logic MOS device. Substrate 20 preferably includes bulk silicon, although other commonly used structures and materials such as silicon-on-insulator (SOI) and silicon alloys can be used. Substrate 20 is preferably lightly doped. For illustration purposes, the subsequently formed memory MOS device is shown as between shallow trench isolation (STI) regions 24. One skilled in the art will realize, however, that memory cells may be connected in series, and thus it is likely that no STI regions are formed between memory cells. Memory device region 100 may be a static random access memory (SRAM) region, a dynamic random access memory (DRAM) region, or even a non-volatile memory region. Logic device region 200 is preferably a core device region, and thus the MOS device formed in subsequently discussed steps is a core MOS device.

Referring again to FIG. 1, gate dielectric layer 26 is formed on substrate 20. In the preferred embodiment, gate dielectric layer 26 has a high dielectric constant (k value), preferably greater than about 3.9. The preferred materials in gate dielectric layer 26 include silicon oxides, silicon nitrides, oxynitrides, and metal oxides such as $HfO_2$, $HfZrO_x$, $HfSiO_x$, $HfTiO_x$, $HfAlO_x$, and the like. Gate dielectric layer 26 preferably has a thickness of less than about 20 Å.

Gate electrode layer 28 is formed on gate dielectric layer 26. In one embodiment, gate electrode layer 28 comprises polysilicon. Alternatively, gate electrode layer 28 comprises other commonly used conductive materials such as metals, metal nitrides, metal silicides, and combinations thereof. The preferred methods for forming gate dielectric layer 26 and gate electrode layer 28 include chemical vapor deposition (CVD) techniques such as low temperature CVD (LTCVD), low pressure CVD (LPCVD), rapid thermal CVD (RTCVD), plasma enhanced CVD (PECVD), and other commonly used methods such as sputtering, physical vapor deposition (PVD), and the like. Gate electrode layer 28 preferably has a thickness of less than about 1200 Å.

Figure 2:
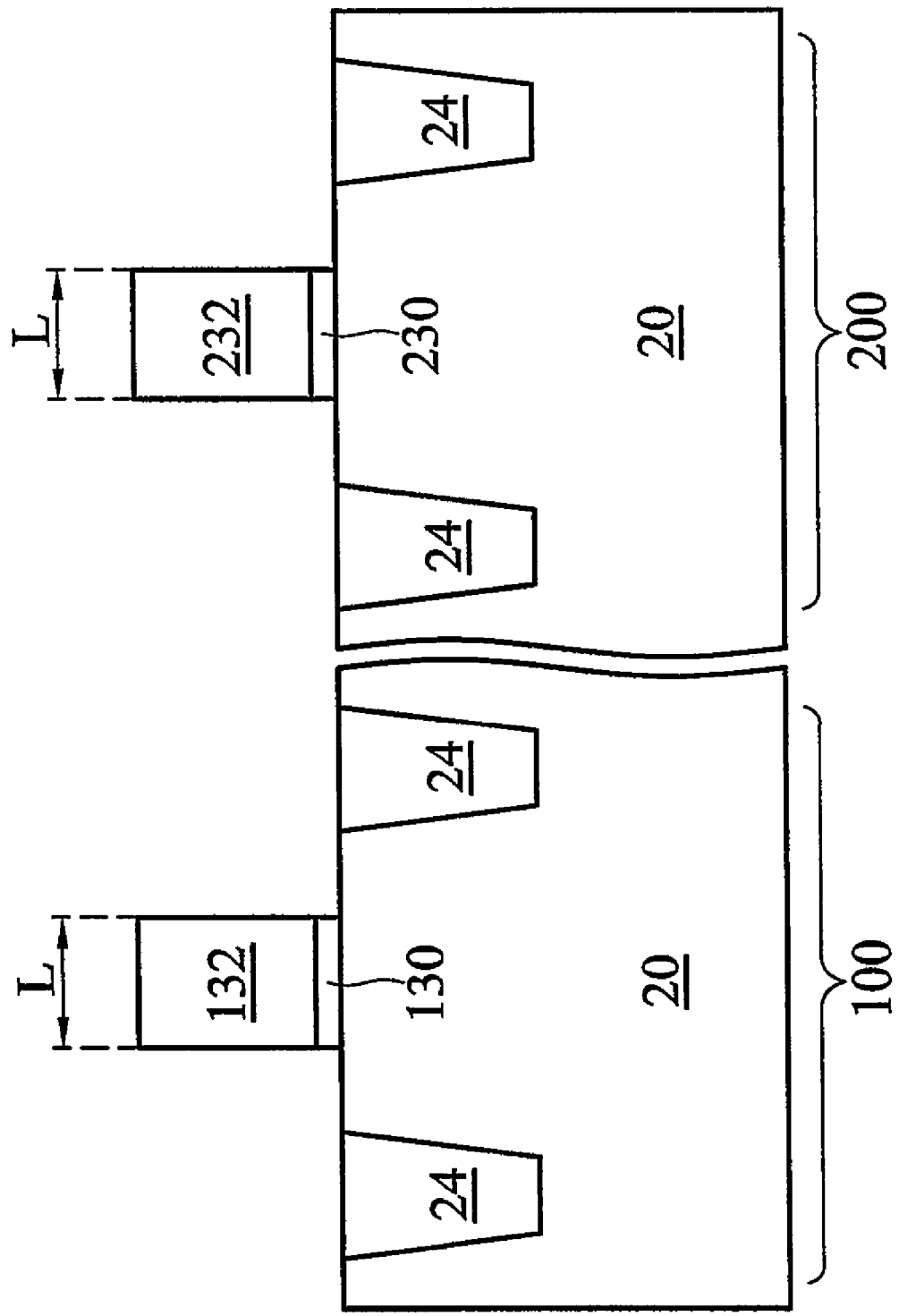

FIG. 2 illustrates the formation of gate stacks. Gate dielectric layer 26 and gate electrode layer 28 are patterned to form a gate stack in memory region 100, which includes gate dielectric 130 and gate electrode 132, and a gate stack in logic device region 200, which includes gate dielectric 230 and gate electrode 232. In the preferred embodiment, the semiconductor device discussed in the present invention is formed using 65 nm technology or below. Accordingly, the minimum length L of gate electrodes 132 and 232 is preferably less than about 60 nm.

Figure 3:
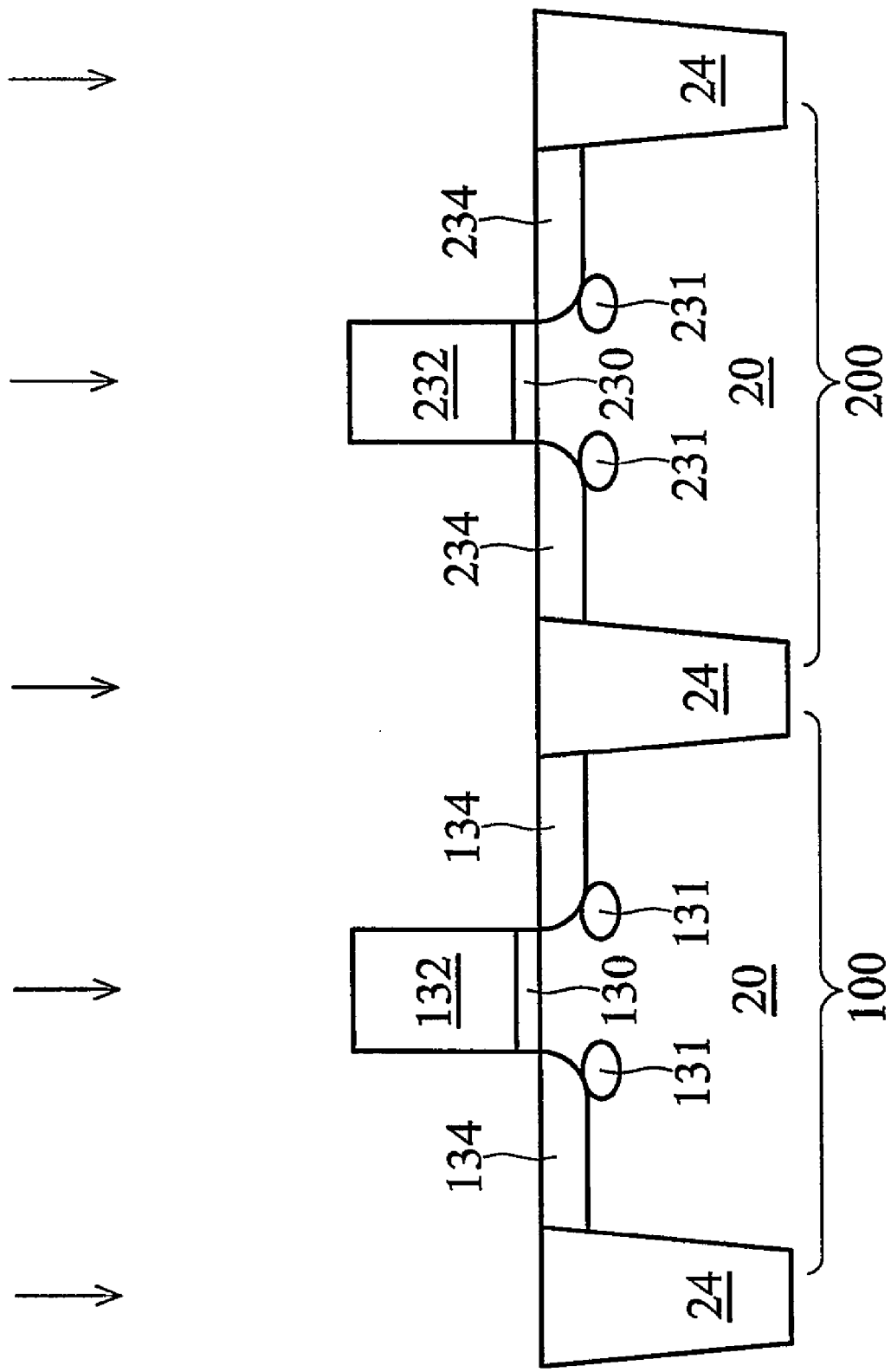

FIG. 3 illustrates the formation of lightly doped source/drain (LDD) regions 134 and 234, wherein LDD regions are often referred to as source and drain extension regions. An implantation is performed to introduce n-type impurities into device regions 100 and 200. Preferably the n-type impurities include arsenic, although phosphorous may also be introduced in addition to arsenic. Gate electrodes 132 and 232 act as masks so that LDD regions 134 and 234 are formed substantially aligned with the edges of gate electrode 132. Pocket regions 131 and 231 are preferably formed by tilt implanting p-type impurities, such as boron and/or indium. In the preferred embodiment, the n-type impurities are implanted to a dosage of between about $5E12/cm^2$ and about $5E14/cm^2$, although different dosages may be used.

Figure 4:
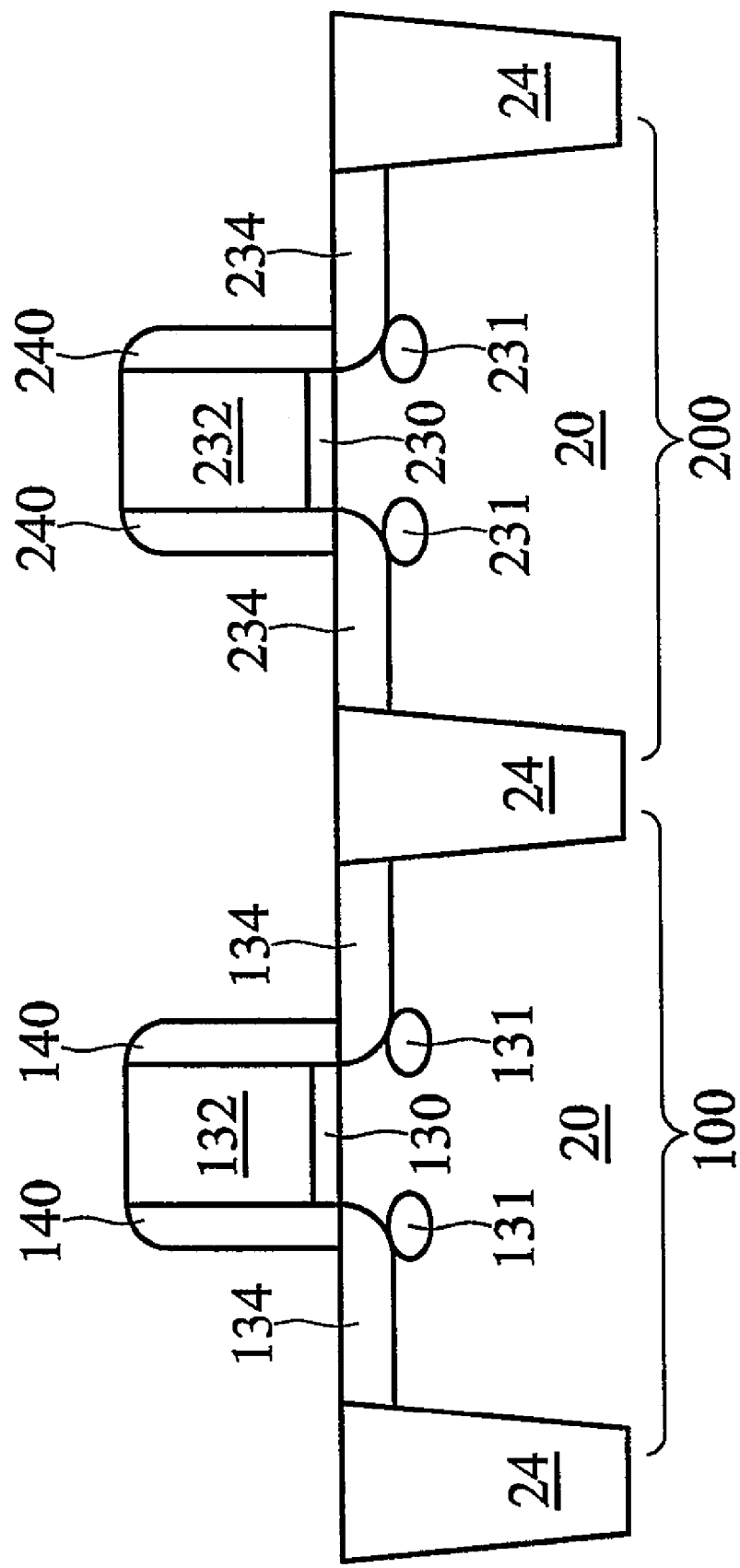

Gate spacers 140 and 240 are then formed, as shown in FIG. 4. As is known in the art, gate spacers 140 and 240 may be formed by blanket depositing one or more dielectric layer, and removing horizontal portions of the dielectric layer. The preferred methods for depositing the dielectric layer include PECVD, LPCVD, sub-atmospheric chemical vapor deposition (SACVD), and the like. In an exemplary embodiment, gate spacers 140 and 240 each include a silicon nitride layer on an oxide liner. The thickness of the resulting gate spacers 140 and 240 is preferably less than about 45 nm.

Figure 5:
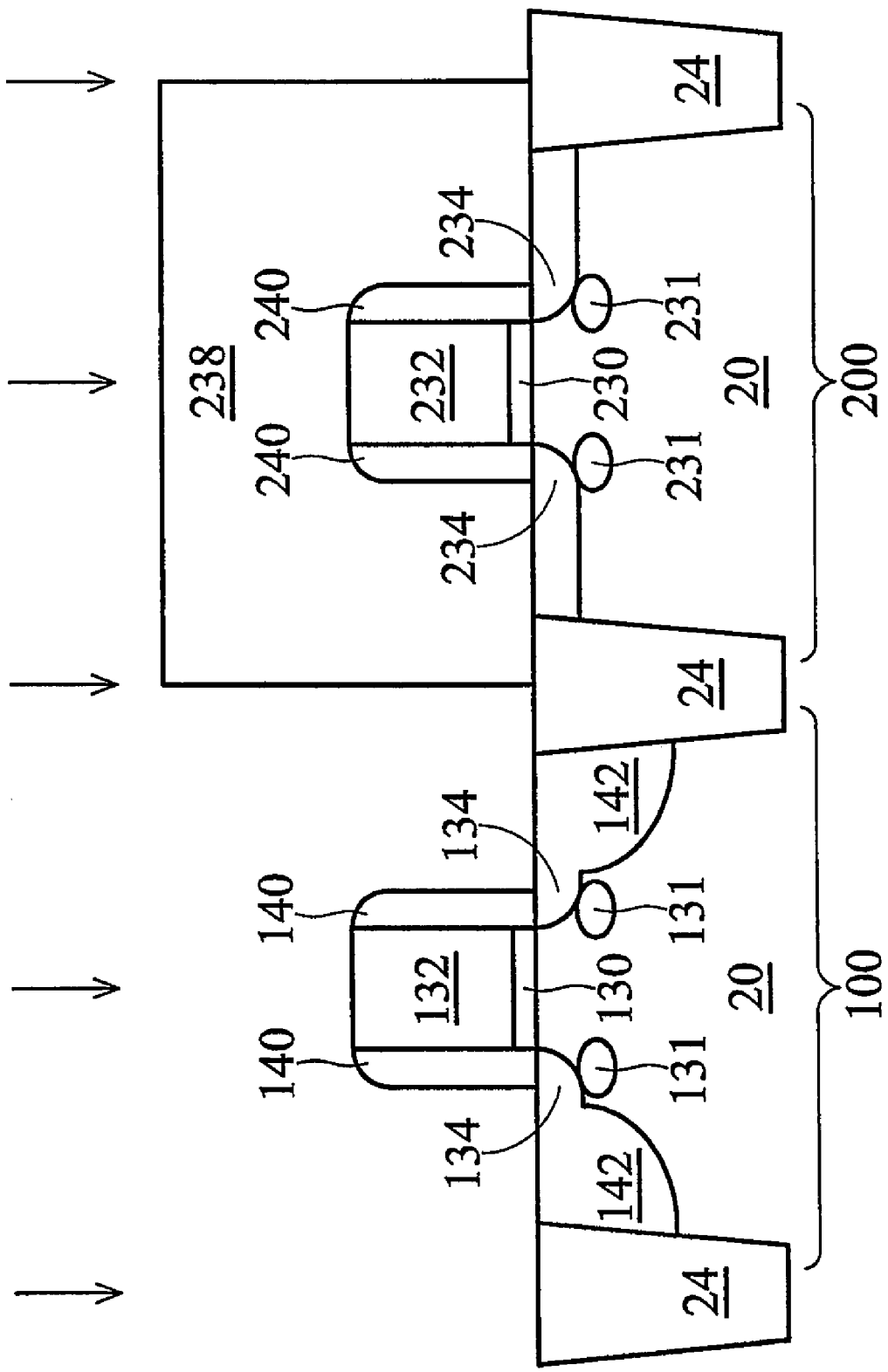
Figure 6:
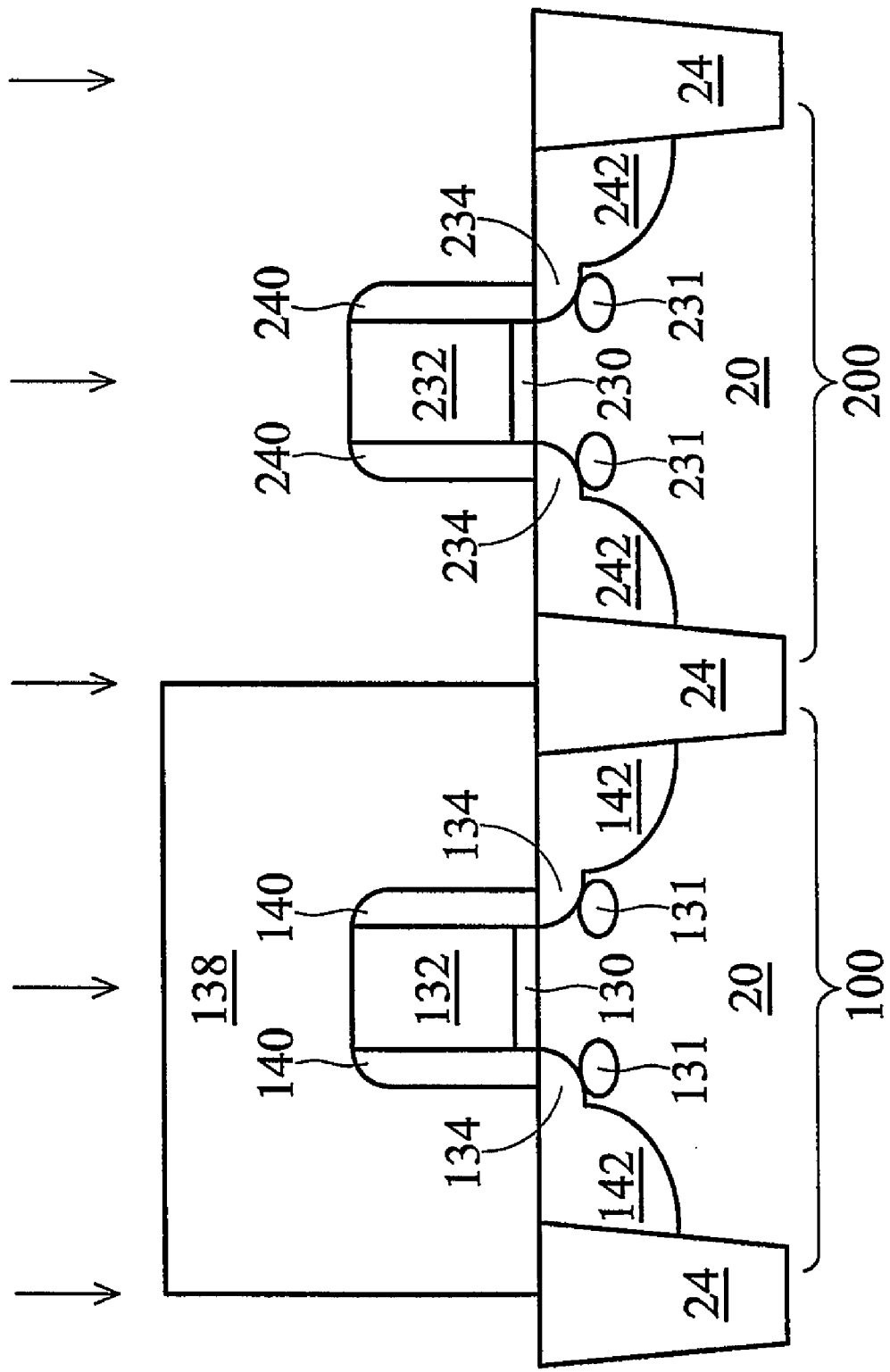

Next, deep source/drain regions 142 and 242 are formed, preferably by implanting n-type impurities. A first embodiment of the present invention is shown in FIGS. 5 and 6. FIG. 5 illustrates the formation of deep source/drain regions 142. Photoresist 238 is formed to mask device region 200, and an implantation is performed to introduce n-type impurities into device region 100. In the preferred embodiment, the implanted impurities include phosphorous with no arsenic. In alternative embodiments, the implanted impurities include both arsenic and phosphorous. However, the dosage of arsenic is significantly lower than the dosage of phosphorous. Preferably, the dosage of arsenic is less than about 30 percent, and more preferably less than about 20 percent, of the dosage of phosphorous. The implanted phosphorous preferably has a heavy concentration close to the surface of source/drain regions 142, and a light concentration deep in source/drain regions 142. To achieve such a profile, multiple implantations may be performed. In an exemplary embodiment, one of the implantations has a high dosage of between about $1E15/cm^2$ and about $6E15/cm^2$, and is implanted with a low energy of between about 0.5 keV and about 10 keV. Another implantation has a low dosage of between about $5E13/cm^2$ and about $1E15/cm^2$, and is implanted with a high energy of between about 1 keV and about 30 keV. Each of the phosphorous implantation may be performed vertically, or tilted. An exemplary tilt angle is less than about 15 degrees.

FIG. 6 illustrates the formation of deep source/drain regions 242. Photoresist 138 is formed to mask memory device region 100, and an implantation is performed to introduce n-type impurities into region 200. In the preferred embodiment, the implanted impurities include arsenic. Phosphorous may be added in addition to arsenic, wherein the dosage of phosphorous is less than, and at most substantially equal to, the dosage of arsenic. In an exemplary embodiment, arsenic and phosphorous are both implanted with a dosage of between about $1E15/cm^2$ and about $5E15/cm^2$. A resulting peak concentration of arsenic is preferably less than about $3E20/cm^3$.

Figure 7:
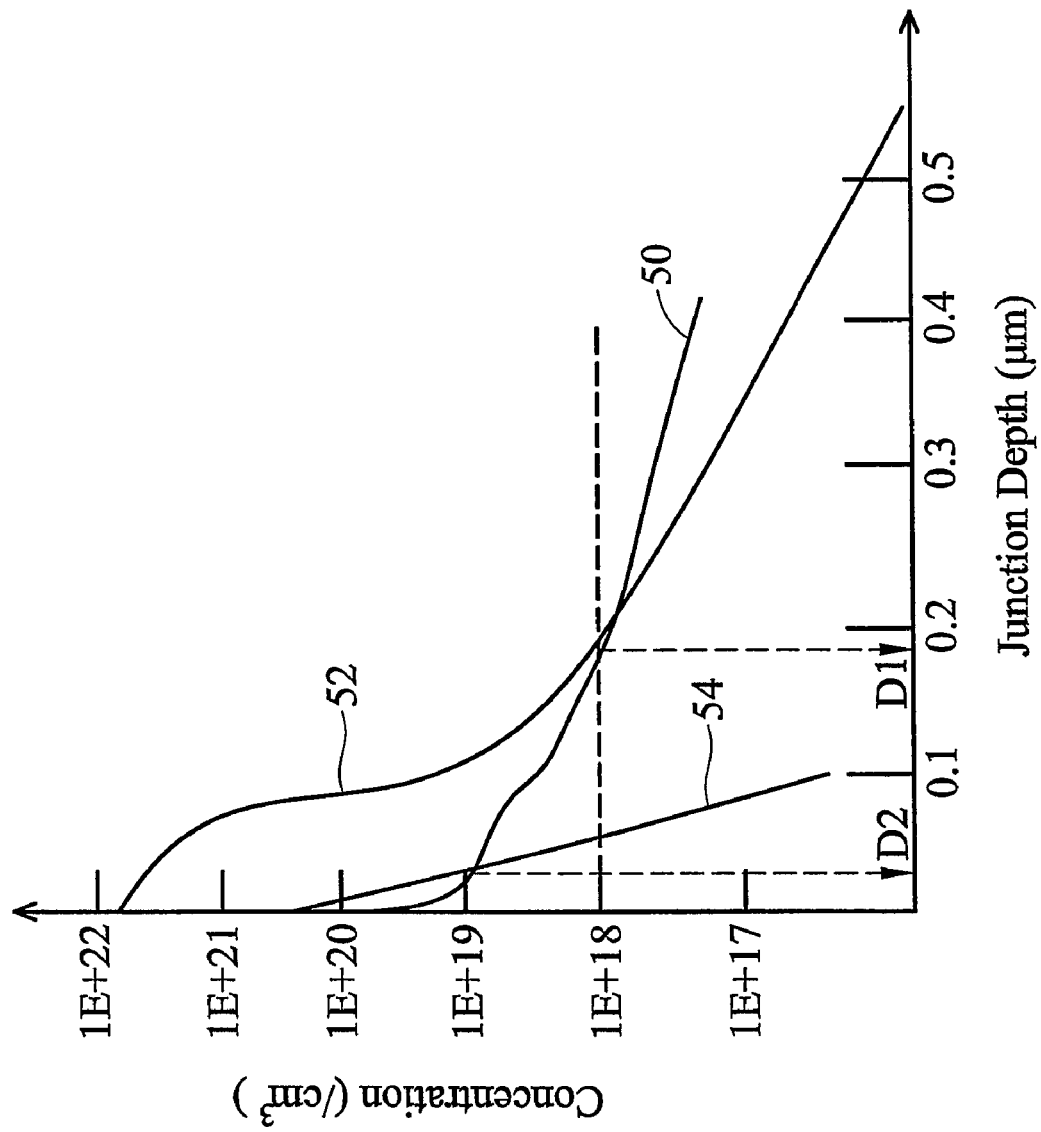
FIGS. 7 and 8 are schematic dopant concentration distributions in a first device region and a second device region, respectively.
Figure 8:
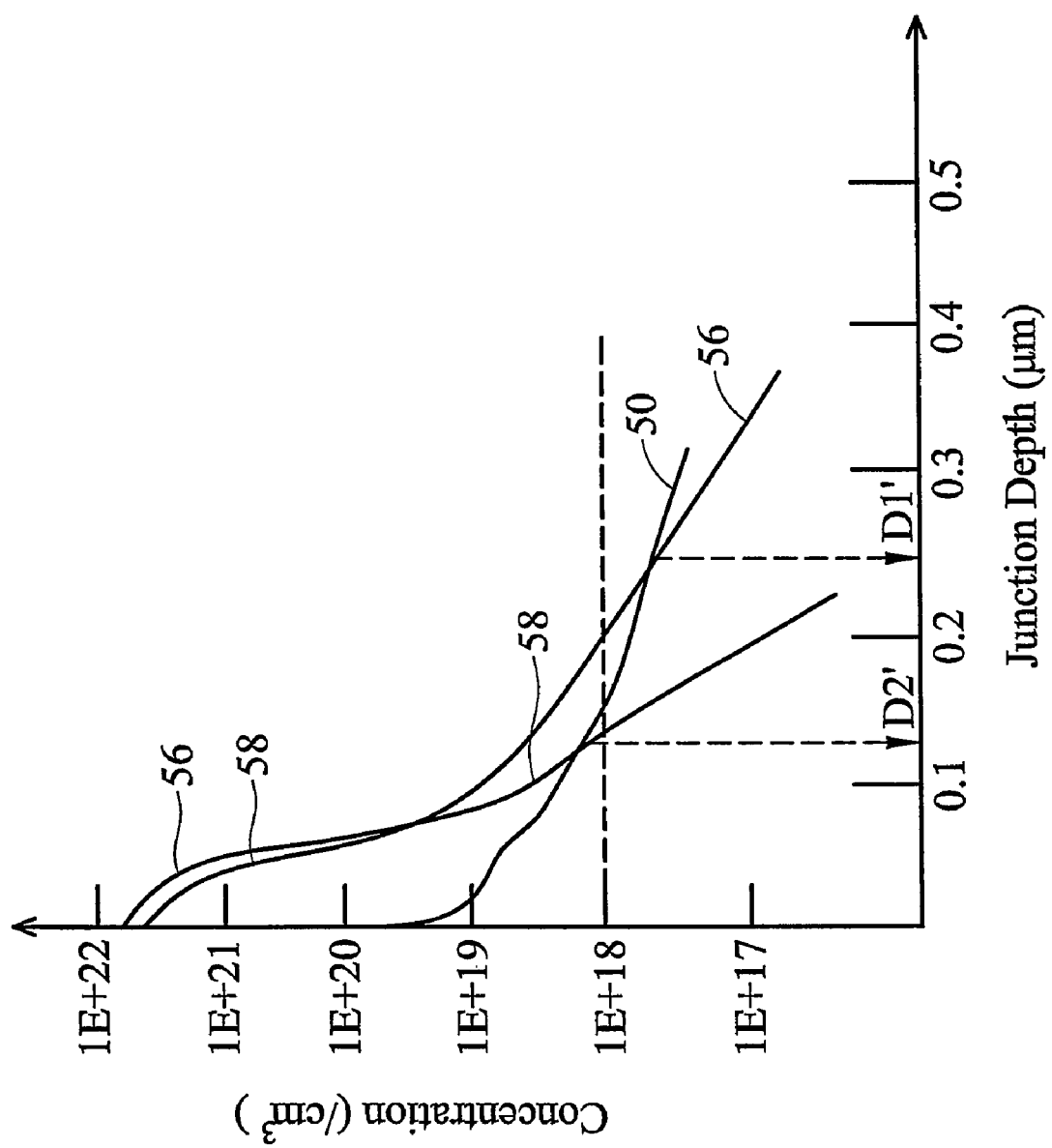

FIGS. 7 and 8 schematically illustrate the distribution of dopant concentrations in deep source/drain regions 142 and 242, respectively. FIG. 7 illustrates the dopant concentrations in deep source/drain regions 142 as a function of depths into substrate 20, wherein only phosphorous is implanted during the deep source/drain implantation. Lines 50, 52 and 54 are concentrations of p-type dopant concentration, phosphorous concentration, and arsenic concentration, respectively. Since arsenic is implanted only for LDD regions 134, the respective arsenic junction between arsenic and the pocket implantation is shallow, with a junction depth D2 of less than about 30 nm. Conversely, the phosphorous junction D1 is significantly greater than arsenic junction depth D2, with a ratio of D1/D2 of greater than about 3, and more preferably between about 3 and 5. The peak concentration of phosphorous to the peak concentration of arsenic is preferably greater than 5, and more preferably greater than 10. Throughout the description, the arsenic junction is defined as where arsenic concentration equals p-type dopant concentrations, and the phosphorous junction is defined to be where phosphorous concentration equals p-type dopant concentrations.

The profiles of impurities shown in FIG. 7 have several advantageous features. Since phosphorous has an atomic weight of about 31, significantly less than the atomic weight of arsenic, which is about 75, the damage to the lattice structure of semiconductor substrate 20 caused by implanting phosphorous is significantly less than the damage caused by implanting arsenic. Accordingly, phosphorous can be used for forming deep source/drain regions without causing substantial piping effects, and hence junction leakage currents. Due to the low diffusion length of arsenic, the implantation of arsenic in LDD regions may improve the short channel effects, particularly for MOS devices formed using 65 nm technology and below. Since memory devices are particularly sensitive to leakage currents, the dopant profiles shown in FIG. 7 is suitable for being used in memory MOS devices.

FIG. 8 illustrates the dopant concentrations in deep source/drain regions 242 as a function of depth into substrate 20, wherein arsenic and phosphorous are doped with a substantially same dosage for the formation of source/drain regions 242. Lines 50, 56 and 58 are concentrations of p-type dopant concentration, phosphorous concentration, and arsenic concentration, respectively. Line 50 shows a similar p-type dopant distribution as in FIG. 7. Since arsenic and phosphorous are implanted with similar dosages in deep source/drain regions 242, arsenic junction depth D2' and phosphorous junction depth D1' have an increased ratio D2'/D1' over ratio D2/D1 (refer to FIG. 7). If source/drain regions 242 are implanted with lower dosage of phosphorous, ratio D2'/D1' may further increase. In the preferred embodiment, junction depth D1' and D2' are comparable. More preferably, the ratio of junction depths D2'/D1' is greater than about 0.5.

Comparing FIGS. 7 and 8, it is noted that arsenic junction depth D2' of the logic MOS device is significantly greater than arsenic junction depth D2 of the memory MOS device, with a preferred junction depth ratio D2'/D2 of greater than about 2. In dopant profiles of memory devices as shown in FIG. 7, arsenic junction depth is preferably less than about 30 nm. In dopant profiles of logic devices as shown in FIG. 8, the arsenic junction depth is preferably greater than about 50 nm. In addition, a peak arsenic concentration in deep source/drain regions 242 of the logic MOS device (FIG. 8) is preferably greater than about three times the peak arsenic concentration in deep source/drain regions 142 of the memory MOS device (refer to FIG. 7).

For logic MOS devices, with higher arsenic concentrations implanted into deep source/drain regions 242, the junction leakage current of the logic MOS device may be higher than that of the memory MOS device. However, the drive current of the logic MOS device is higher. Advantageously, for logic MOS devices, the drive currents are of a greater concern than for memory MOS devices.

Figure 9:
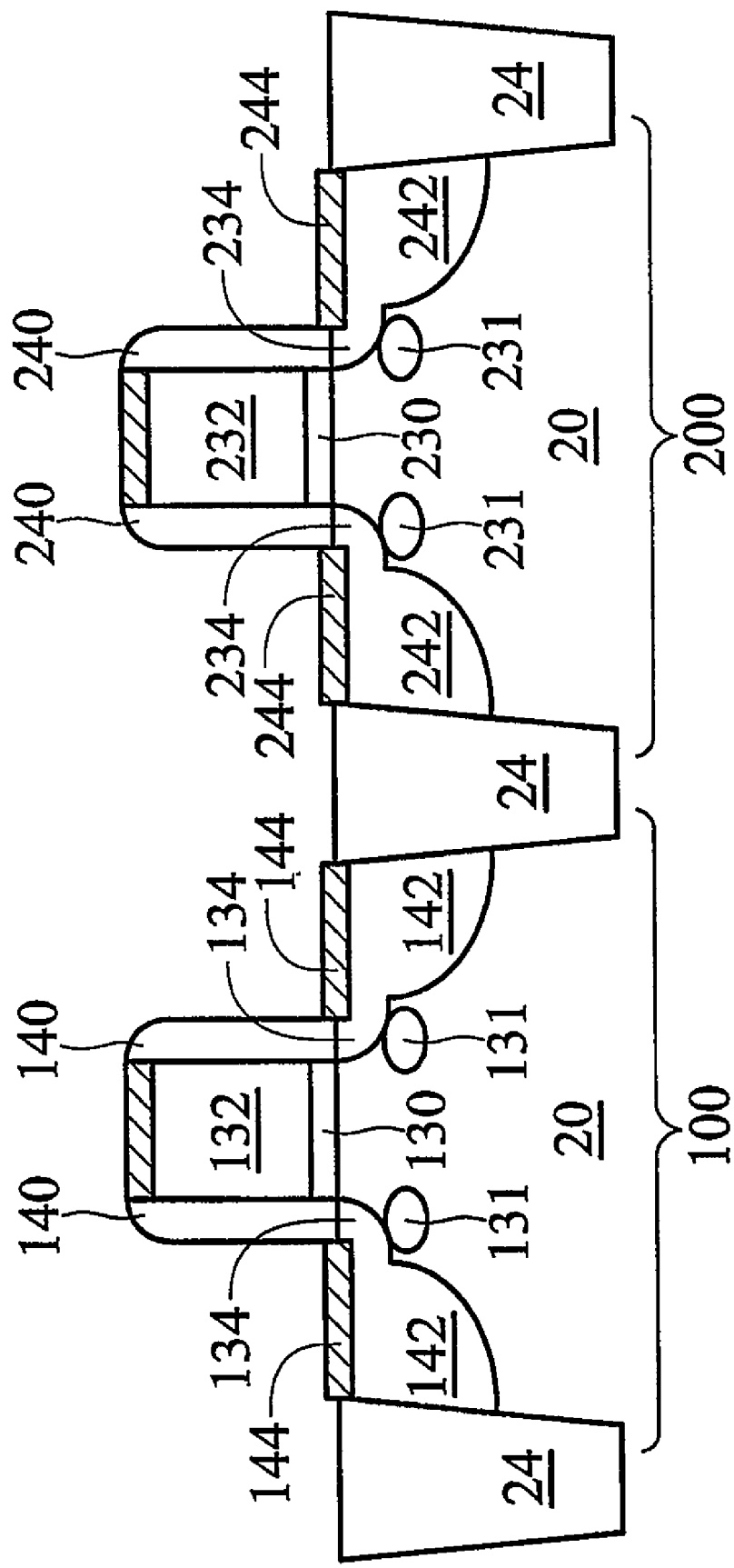
FIG. 9 illustrates the formation of silicide regions.

FIG. 9 illustrates the formation of silicide regions 144 and 244. A metal layer (not shown), which may include nickel, cobalt, platinum, and combinations thereof, is deposited. Substrate 20 is then heated, causing a silicidation between the metal layer and the underlying silicon, and thus silicide regions 144 and 244 are formed. The un-reacted metal layer is then removed using an etchant attacking the metal layer, but not silicide regions 144 and 244.

To finish the formation of MOS devices, an etch stop layer (ESL) (not shown) and an inter-layer dielectric (ILD) (not shown) are then formed. The details for forming the ESL and the ILD are well known in the art, thus are not repeated herein.

Figure 10:
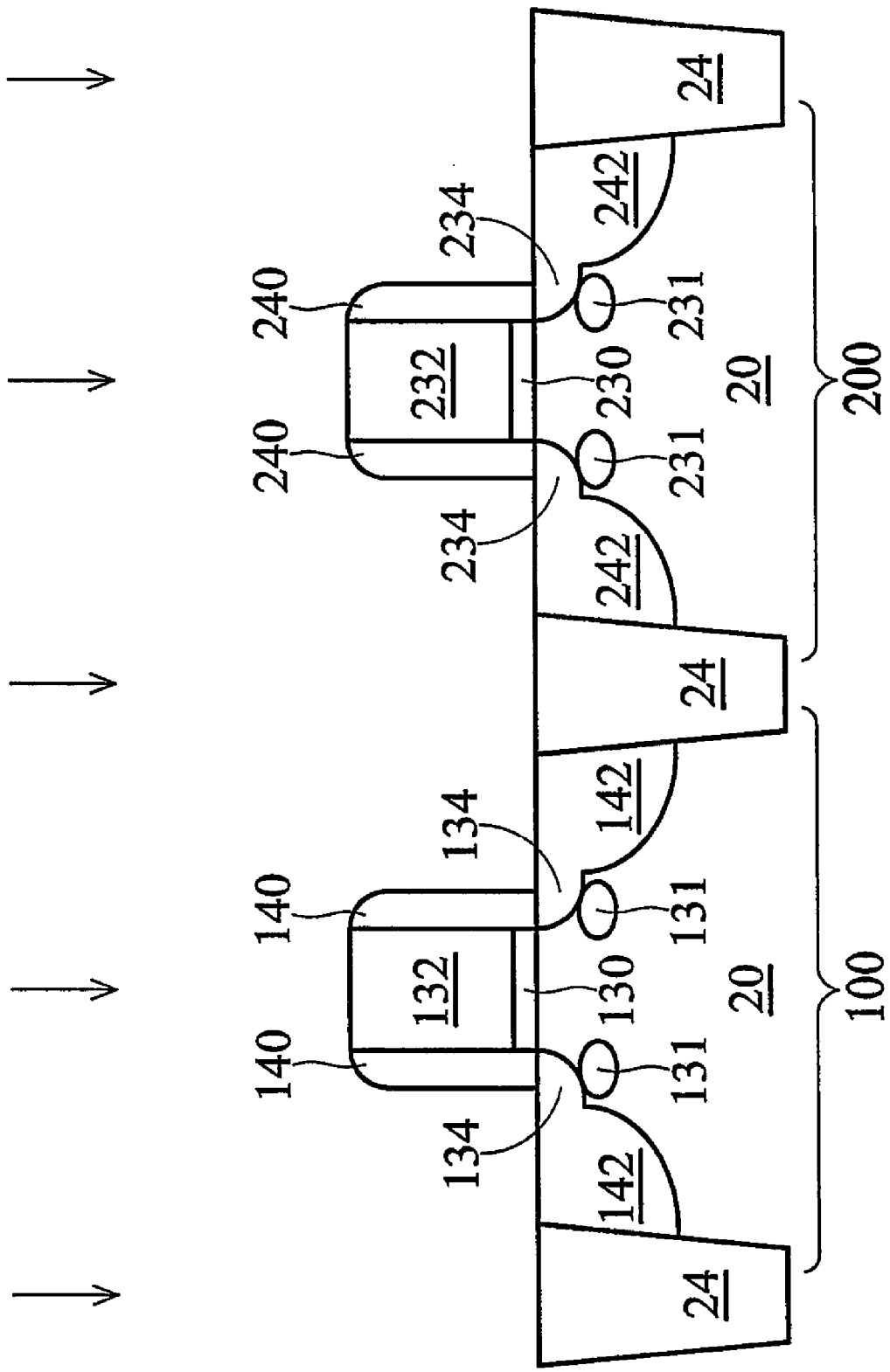
FIG. 10 illustrates a cross-sectional view of an intermediate stage in the manufacturing of an alternative embodiment of the present invention, wherein MOS devices in the first and the second device regions have same dopant profiles.

FIG. 10 illustrates a second embodiment of the present invention, in which the memory MOS device and the logic MOS device have a same dopant profile. The initial stages and structures are essentially the same as shown in FIGS. 1 through 4. FIG. 10 illustrates the formation of deep source/drain regions 142 and 242. Both device regions 100 and 200 are exposed to n-type impurity implantations simultaneously, and thus the profiles of the resulting memory MOS device and logic MOS device are substantially the same. Preferably, the implantation for forming deep source/drain regions 142 and 242 is essentially the same as the implantation for forming deep source/drain regions 142 in the first embodiment (refer to FIG. 5). In the preferred embodiment, the implanted impurities include phosphorous with no arsenic. In alternative embodiments, the implanted impurities include both arsenic and phosphorous. However, the dosage of arsenic is significantly lower than the dosage of phosphorous. Preferably, the dosage of arsenic is less than about 30 percent, and more preferably less than about 20 percent, of the dosage of phosphorous.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor structure comprising:
   a semiconductor substrate;
   a first gate dielectric on the semiconductor substrate;
   a first gate electrode over the first gate dielectric;
   a first lightly doped source or drain (LDD) region in the semiconductor substrate and adjacent the first gate dielectric, wherein the first LDD region comprises arsenic; and
   a first deep source/drain region in the semiconductor substrate and adjacent the first gate dielectric, wherein the first deep source/drain region comprises phosphorous, wherein a first phosphorous junction depth in the first deep source/drain region is greater than about three times a first arsenic junction depth in the first deep source/drain region, and wherein a peak concentration of phosphorous to a peak concentration of arsenic has a ratio of greater than about 5.

2. The semiconductor structure of claim 1, wherein a ratio of the first phosphorous junction depth to the first arsenic junction depth is between about 3 and about 5.

3. The semiconductor structure of claim 1, wherein the semiconductor structure is in a memory circuit.

4. The semiconductor structure of claim 1, wherein the first gate electrode has a length of less than about 60 nm.

5. The semiconductor structure of claim 1 further comprising:
   a second gate dielectric on the semiconductor substrate;
   a second gate electrode over the second gate dielectric;

a second LDD region in the semiconductor substrate and adjacent the second gate dielectric, wherein the second LDD region comprises arsenic; and a second deep source/drain region in the semiconductor substrate and adjacent the second gate dielectric, wherein the second deep source/drain region comprises arsenic and phosphorous, and wherein a second arsenic junction depth is substantially comparable to a second phosphorous junction depth.

6. The semiconductor structure of claim 5, wherein a ratio of the second arsenic junction depth to the second phosphorous junction depth is greater than about 0.5.

7. The semiconductor structure of claim 6, wherein a peak concentration of arsenic in the second deep source/drain region is less than about 3E20/cm³.

8. A semiconductor structure comprising:
a semiconductor substrate;
a gate dielectric on the semiconductor substrate;
a gate electrode over the gate dielectric;
a lightly doped source or drain (LDD) region in the semiconductor substrate and adjacent the gate dielectric, wherein the LDD region comprises arsenic; and
a deep source/drain region in the semiconductor substrate and adjacent the gate dielectric, wherein the deep source/drain region comprises phosphorous, and wherein a peak phosphorous concentration in the deep source/drain region is greater than about five times a peak arsenic concentration in the deep source/drain region.

9. The semiconductor structure of claim 8, wherein a ratio of a phosphorous junction depth to an arsenic junction depth in the deep source/drain region is greater than about 3.

10. The semiconductor structure of claim 8, wherein an arsenic junction depth in the deep source/drain region is less than about 30 nm.

11. The semiconductor structure of claim 8, wherein the semiconductor structure is in a memory circuit.

12. The semiconductor structure of claim 8, wherein the gate electrode has a length of less than about 60 nm.

13. The semiconductor structure of claim 8 further comprising a suicide region on the deep source/drain region, wherein the silicide region comprises nickel.

14. A semiconductor structure comprising:
a semiconductor substrate comprising a first region and a second region;
a memory metal-oxide-semiconductor (MOS) device in the first region, the memory MOS device comprising:
a first gate dielectric on the semiconductor substrate;
a first gate electrode over the first gate dielectric;
a first lightly doped source or drain (LDD) region in the semiconductor substrate and adjacent the first gate dielectric, wherein the first LDD region comprises arsenic; and
a first deep source/drain region in the semiconductor substrate and adjacent the first gate dielectric, wherein the first deep source/drain region comprises phosphorous, and wherein a phosphorous junction depth in the first deep source/drain region is greater than an arsenic junction depth in the first deep source/drain region; and
a logic MOS device in the second region, the logic MOS device comprising:
a second gate dielectric on the semiconductor substrate;
a second gate electrode over the second gate dielectric;
a second LDD region in the semiconductor substrate and adjacent the second gate dielectric, wherein the second LDD region comprises arsenic; and
a second deep source/drain region in the semiconductor substrate and adjacent the second gate dielectric, wherein the second deep source/drain region comprises arsenic and phosphorous, and wherein an arsenic junction depth in the second deep source/drain region is substantially comparable to a phosphorous junction depth in the second deep source/drain region, and wherein the arsenic junction depth in the second deep source/drain region is greater than about two times the arsenic junction depth in the first deep source/drain region.

15. The semiconductor structure of claim 14, wherein a peak phosphorous concentration in the first deep source/drain region of the memory MOS device is greater than about three times a peak arsenic concentration in the first deep source/drain region of the memory MOS device.

16. The semiconductor structure of claim 14, wherein a peak arsenic concentration in the second deep source/drain region of the logic MOS device is greater than about two times a peak arsenic concentration in the first deep source/drain region of the memory MOS device.

17. The semiconductor structure of claim 14, wherein the phosphorous junction depth in the first deep source/drain region of the memory MOS device is greater than about three times the arsenic junction depth in the first deep source/drain region of the memory MOS device.

18. The semiconductor structure of claim 14, wherein the arsenic junction depth in the second deep source/drain region of the logic MOS device is greater than about two times the arsenic junction depth in the first deep source/drain region of the memory MOS device.

* * * * *

UNITED STATES PATENT AND TRADEMARK OFFICE
CERTIFICATE OF CORRECTION

PATENT NO. : 7,649,226 B2
APPLICATION NO. : 11/702807
DATED : January 19, 2010
INVENTOR(S) : Liaw et al.

It is certified that error appears in the above-identified patent and that said Letters Patent is hereby corrected as shown below:

In Col. 7, line 42, Claim 13, delete "suicide" and insert --silicide--.

Signed and Sealed this

Ninth Day of March, 2010

David J. Kappos
*Director of the United States Patent and Trademark Office*